United States Patent [19]

Nagayama

[11] Patent Number: 5,552,892
[45] Date of Patent: Sep. 3, 1996

[54] ILLUMINATION OPTICAL SYSTEM, ALIGNMENT APPARATUS, AND PROJECTION EXPOSURE APPARATUS USING THE SAME

[75] Inventor: Tadashi Nagayama, Ota-ku, Japan

[73] Assignee: Nikon Corporation, Japan

[21] Appl. No.: 446,346

[22] Filed: May 22, 1995

[30] Foreign Application Priority Data

| May 24, 1994 | [JP] | Japan | 6-132395 |
| Sep. 6, 1994 | [JP] | Japan | 6-212684 |

[51] Int. Cl.⁶ .................................. G01B 11/00
[52] U.S. Cl. ........................... 356/401; 250/548
[58] Field of Search ......................... 356/363, 401, 356/400; 250/548

[56] References Cited

U.S. PATENT DOCUMENTS

| 2,983,193 | 5/1961 | Schade . | |
| 4,402,596 | 9/1983 | Kanatani . | |
| 4,870,452 | 9/1989 | Tanimoto et al. | 356/400 |
| 4,938,598 | 7/1990 | Akiyama et al. | 356/401 |
| 5,150,173 | 9/1992 | Isobe et al. | 250/548 |

OTHER PUBLICATIONS

Nikon Industrial Microscopes published on Jan. 1, 1991 by Nikon.
Metaphot–66/Optiphot–66 published on Oct. 17, 1984 by Nikon.

*Primary Examiner*—Frank Gonzalez
*Assistant Examiner*—Robert Kim
*Attorney, Agent, or Firm*—Pennie & Edmonds

[57] ABSTRACT

An illumination optical system and an alignment apparatus suitable for reticle alignment in the projection exposure apparatus. There is provided an illumination optical system having parallel beam supply means for supplying a parallel beam and a light guide for guiding the parallel beam from the parallel beam supply means to a target illumination object, comprising diffusion means, arranged between the parallel beam supply means and the light guide, for diffusing the parallel beam, wherein an incident end face of the light guide is arranged to be inclined by a predetermined angle with respect to a plane perpendicular to a direction of incidence of the parallel beam onto the diffusion means.

10 Claims, 14 Drawing Sheets

FIG. 4
(Prior Art)
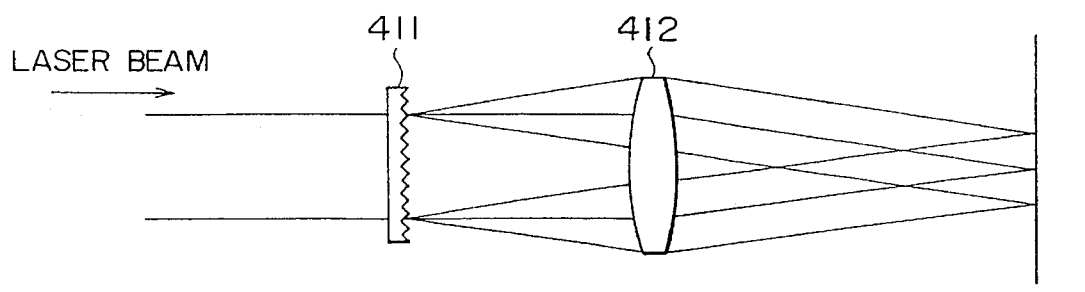
FIG. 5
(Prior Art)
FIG. 6
(Prior Art)
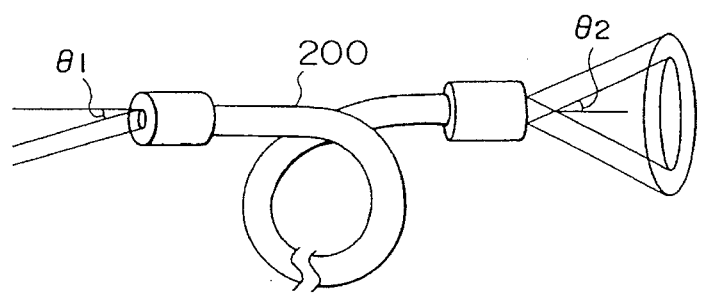
FIG. 7
(Prior Art)
FIG. 8
(Prior Art)
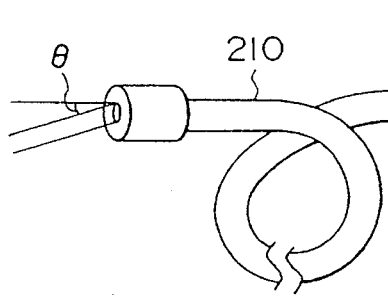
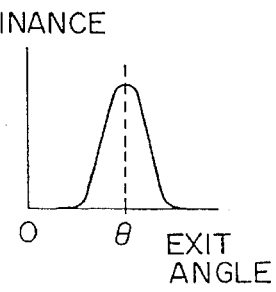

LUMINANCE DISTRIBUTION

ILLUMINATION OPTICAL SYSTEM, ALIGNMENT APPARATUS, AND PROJECTION EXPOSURE APPARATUS USING THE SAME

BACKGROUND OF THE INVENTION

1. Field of the Invention

The present invention relates to an illumination optical system, and more particularly, an illumination optical system used for a reticle alignment optical system of a projection exposure apparatus, and an alignment apparatus, and more particularly, an alignment apparatus suitable for reticle alignment in the projection exposure apparatus.

2. Related Background Art

In the alignment optical system of a projection exposure apparatus, when light supply itself must have some degree of freedom to illuminate a moving target object, e.g., when a transparent alignment mark provided on an index plate on a movable stage is to be illuminated to cause light to emerge therefrom, an illumination optical system having a light guide consisting of an optical fiber is used as an illumination optical system for illuminating the alignment mark. FIG. 1 is a view showing such a conventional illumination optical system using an optical fiber.

Referring to FIG. 1, a light beam radiated from a mercury lamp 300 serving as a light source is focused upon reflection by an elliptical mirror 301 and incident on an optical fiber 303 through a lens system 302. At this time, a light source image having a sufficient numerical aperture and diameter is formed at the incident end of the optical fiber 303. The light beam emerging from the optical fiber 303 forms an illumination field having an appropriate diameter and illumination numerical aperture through a condenser lens 304.

On the other hand, in manufacturing a semiconductor element or a liquid crystal display element, a projection exposure apparatus is used in which a reticle (or a photomask or the like) is illuminated with exposure light, and the pattern of the reticle is focused and projected onto a wafer (or a glass plate or the like) coated with a photoresist through a projection optical system. Conventionally, continuously emitted light such as a beam from a mercury lamp (e.g., the g-ray or the i-ray) is used as the exposure light. In such a projection exposure apparatus, the reticle and wafer must be accurately aligned with each other in the exposure operation. For this purpose, first of all, the reticle is aligned with respect to a reticle stage by using a measurement result from a reticle alignment system.

Upon completion of reticle alignment, the position of the reticle is measured with reference to a wafer stage on which the wafer is mounted. The wafer is aligned on the basis of the measurement result. To measure the positional relationship of the reticle with respect to the wafer stage, a reticle position detection system of a so-called stage light emission type is used in some cases.

SUMMARY OF THE INVENTION

According to the present invention, there is provided an illumination optical system having parallel beam supply means for supplying a parallel beam and a light guide for guiding the parallel beam from the parallel beam supply means to a target illumination object, comprising diffusion means, arranged between the parallel beam supply means and the light guide, for diffusing the parallel beam, wherein an incident end face of the light guide is arranged to be inclined by a predetermined angle with respect to a plane perpendicular to a direction of incidence of the parallel beam onto the diffusion means.

Relation $4° \leq \theta \leq 10°$ is preferably satisfied, where $\theta$ is an inclination angle of the incident end face of the light guide with respect to the plane perpendicular to the direction of incidence of the parallel beam onto the diffusion means.

According to the present invention, an alignment apparatus is provided to a projection exposure apparatus having an illumination optical system for illuminating a mask on which a target transferred pattern is formed with pulsed exposure light, a projection optical system for projecting an image of the pattern of the mask onto a photosensitive substrate with the exposure light, and a substrate stage for holding the substrate and positioning the substrate on a plane perpendicular to an optical axis of the projection optical system, and detects a position of the mask by using an alignment mark formed on the mask and a reference mark arranged on the substrate stage.

The alignment apparatus according to the present invention comprises a first alignment illumination system for illuminating the alignment mark on the mask with continuously emitted continuous illumination light in a wavelength range different from that of the exposure light, a second alignment illumination system for illuminating the alignment mark and the reference mark on the substrate stage with pulse illumination light obtained upon branching the pulsed exposure light, a first objective optical system for focusing the continuous illumination light from the alignment mark, the pulse illumination light from the alignment mark, and the pulse illumination light from the reference mark through the projection optical system, a wavelength selection optical system for dividing a light beam focused by the first objective optical system into a light beam by the continuous illumination light and a light beam by the pulse illumination light, a second objective optical system for forming an image of the alignment mark from the light beam by the continuous illumination light divided by the wavelength selection optical system, image position detection means, having photoelectric detection means, for relatively vibrating the photoelectric detection means and the image of the alignment mark which is obtained by the continuous illumination light, thereby detecting a position of the image of the alignment mark.

In addition, the alignment apparatus according to the present invention comprises a third objective optical system for forming the images of the alignment mark and the reference mark from the light beam of the pulse illumination light divided by the wavelength selection optical system, and image pickup means for picking up the images of the alignment mark and the reference mark which are obtained from the pulse illumination light, wherein a positional relationship of the mask with respect to the image position detection means is detected on the basis of a detection result from the image position detection means, and a positional shift between the alignment mark and the reference mark on the basis of a detection result from the image pickup means.

In this case, it is preferable that the first objective optical system be arranged to be movable in correspondence with the position of the alignment mark on the mask, and the apparatus further comprise a correction optical system, arranged between the wavelength selection optical system and the second objective optical system, or between the wavelength selection optical system and the third objective optical system, for converting the light beam from the first objective optical system into a parallel beam in a manner interlocked with the first objective optical system.

When the first alignment illumination system performs incident-light illumination of the alignment mark from an upper side of the mask, the apparatus preferably comprises a movable mirror, arranged to be freely inserted between the mask and the projection optical system, for reflecting the continuous illumination light transmitted through the mask toward the alignment mark.

In this case, the apparatus preferably comprises a field stop arranged on a plane conjugate with an arrangement plane of the movable mirror in the first alignment illumination system.

According to the alignment apparatus of the present invention, the alignment mark on the mask and the reference mark on the substrate stage side are illuminated by the second alignment illumination system using the pulse illumination light obtained upon branching the exposure light, and the images of the two marks are picked up by the image pickup means. Therefore, the positional relationship of the mask with respect to the substrate stage is measured on the basis of the obtained images. At this time, since the pulse illumination light has the same wavelength as that of the exposure light, the projection optical system has no chromatic aberration, and the two marks are sharply focused on the image pickup surface of the image pickup means.

In addition, the image position detection means such as a photoelectric microscope for relatively vibrating the image of the alignment mark and the photoelectric detection means to detect the position of the image of the alignment mark uses the continuous illumination light. For this reason, the position of the mask with respect to the image position detection means is accurately detected.

When the first objective optical system is arranged to be movable in correspondence with the position of the alignment mark on the mask, and an alignment mark at the different position is to be detected, the first objective optical system must be accordingly moved along the mask. However, the pulsed exposure light is generally in a far-ultraviolet range, and the usable glass material is limited. For this reason, it is difficult to convert the light beam from the first objective optical system into a parallel beam commonly for the pulse illumination light and the continuous illumination light. When a parallel system is formed on the pulse illumination light side, the correction optical system is arranged between the wavelength selection optical system and the second objective optical system. This correction optical system converts the light beam from the first objective optical system in a manner interlocked with the first objective optical system. With this arrangement, even when the first objective optical system moves on the mask, position detection can be accurately performed.

Furthermore, when the first alignment optical system performs incident illumination of the alignment mark from the upper side of the mask, the movable mirror is inserted between the alignment mark on the mask and the projection optical system. In this case, transmission illumination of the alignment mark is performed with the light reflected by the movable mirror. Therefore, even when the alignment mark has a low reflectance, position detection can be accurately performed.

At this time, when the field stop is arranged on the plane conjugate with the arrangement plane of the movable mirror in the first alignment illumination system, the same illuminance distribution can be obtained at the alignment mark in either the presence or absence of the movable mirror.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 4 is a view schematically showing the illumination optical system using a diffusion plate;

FIG. 5 is a view of an optical path, which shows the optical characteristics of a light guide consisting of a bundle of aligned optical fibers;

FIG. 6 is a graph showing the angular characteristics of luminance of light emerging from the light guide shown in FIG. 5;

FIG. 7 is a view of an optical path, which shows the optical characteristics of a random light guide;

FIG. 8 is a graph showing the angular characteristics of luminance of light emerging from the light guide shown in FIG. 7;

DESCRIPTION OF THE PREFERRED EMBODIMENTS

Currently, an excimer laser is used as a light source for the alignment apparatus of a projection exposure apparatus. On the other hand, an optical fiber compatible with the excimer laser in durability, such as a quartz fiber has been developed. Therefore, an alignment illumination optical system constituted by an optical fiber optical system using an excimer laser as a light source and having some degree of freedom can be considered.

Figure 1:
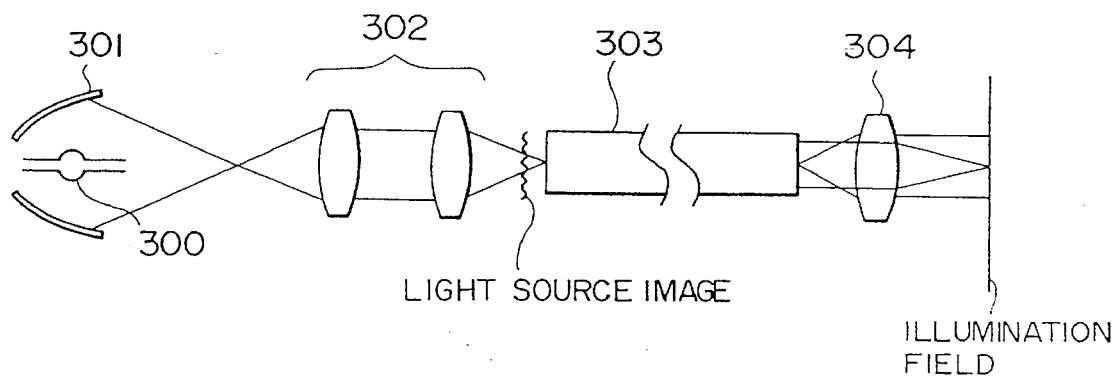
FIG. 1 is a view schematically showing a conventional alignment illumination optical system.
Figure 2:
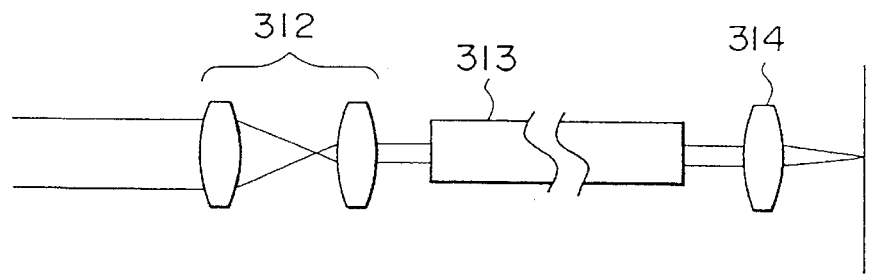
FIG. 2 is a view schematically showing the illumination optical system in FIG. 1 which uses an excimer laser source.

However, an excimer laser beam is a parallel beam with a high directivity. When this beam is used as illumination light, the illumination numerical aperture is almost zero. When the optical fiber optical system of the prior art, as shown in FIG. 1, is used, not only a desired illuminance distribution cannot be obtained with a laser beam through a lens system 312, an optical fiber 313, and a condenser lens 314, but also an illumination field itself cannot be formed. Therefore, the conventional system cannot be used as the illumination optical system of an alignment apparatus.

Figure 3:
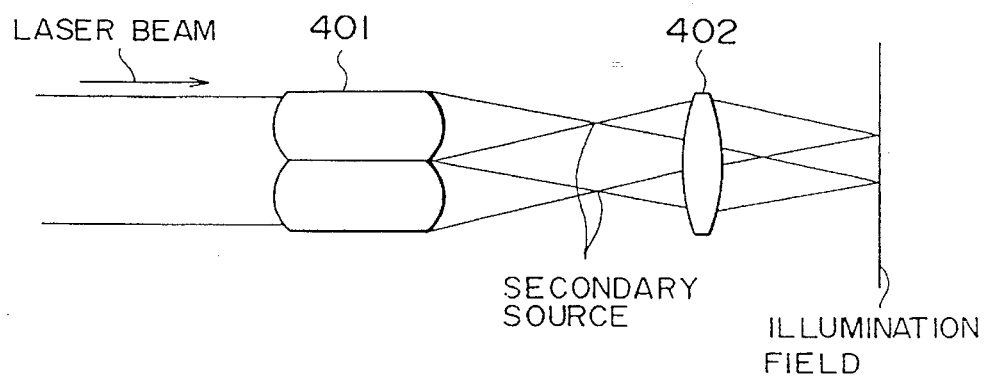
FIG. 3 is a view schematically showing the illumination optical system using a fly-eye lens.

To eliminate illuminance variations of the laser and ensure the illumination numerical aperture in the illumination optical system of this type, a method can be applied to the illumination optical system, in which the laser beam is caused to pass through a fly-eye lens 401 to form a secondary source, and Köhler illumination is performed with the light beam from this secondary source through a condenser lens 402, thereby forming an illumination field, as shown in FIG. 3. Alternatively, a method can be applied in which the diffusion function of a diffusion plate 411 is used to form the secondary source of a laser beam on the exit surface, and Köhler illumination is performed with the light beam from this secondary source through a condenser lens 412, thereby forming an illumination field, as shown in FIG. 4.

In the system using the fly-eye lens 401 in FIG. 3, however, if the number of lenses of the fly-eye lens 401 is not sufficiently large (four-lens structure in FIG. 3), illuminance variations of the incident laser beam cannot be sufficiently corrected. On the other hand, an increase in number of lenses is disadvantageous for the cost. Even a laser which is not so good in coherency, such as an excimer laser produces interference fringes on the illumination field because of two-beam interference between adjacent lens elements, so uniform illumination cannot be obtained.

On the other hand, a system using the diffusion plate 411 in FIG. 4 exhibits an illuminance variation distribution having a shape like that of a regular distribution on the illumination field because of the angular characteristics after the light beam passes through the diffusion plate. For this reason, with the normal condenser lens 412, uniform illuminance distribution cannot be obtained, and only a limited area at the center of the illumination field, which allows to neglect illuminance variations, can be used, resulting in a degradation in illumination efficiency. In addition, even a laser which is not so good in coherency, such as an excimer laser produces speckles on the illumination field to result in random illuminance variations.

If such an illumination optical system is used for an alignment apparatus, alignment precision is degraded.

In the illumination optical system according to the present invention, when a parallel beam supplied from a parallel beam supply means is to be guided to a target illumination object side through a light guide, the parallel beam is diffused by a diffusion means arranged between the parallel beam supply means and the incident end of the light guide. At the same time, the incident end face of the light guide is arranged to be inclined by a predetermined angle with respect to a plane perpendicular to the direction of incidence of the parallel beam onto the diffusion means.

The light guide used here is a light guide constituted by a bundle of thin glass fibers, in which the position of a certain single fiber on the incident side section is arranged at random with respect to its exit side section (to be referred to as a random light guide hereinafter). A product available from Hoya-Schott Kabushiki Kaisha can be used as the random light guide. The optical nature of a random light guide excellent in randomness will be described below.

As shown in FIG. 5, a light guide 200 constituted by a bundle of perfectly aligned optical fibers has an incident angle $\theta_1$ almost equal to an exit angle $\theta_2$. The section of the light beam is spread to form a doughnut-like shape because the light beam emerges in random directions. The distribution of light amount on the incident end face is also maintained on the exit end face (FIG. 6). However, since only the core portions of the bundled optical fibers transmit a light beam, the light amount in gaps between the optical fibers or in the clad portions becomes zero.

To the contrary, in a random light guide, the optical fibers are twisted inside at random, as shown in FIG. 7. For this reason, the exit angle is maintained to spread with respect to the incident angle. This means that the random light guide has an angular diffusion effect. Since the light beam emerges in random directions, the section of the light beam has a doughnut-like shape, and the distribution of light amount becomes symmetrical about its center. The distribution of light amount can be regarded to be almost uniform on the exit end face.

Figure 9:
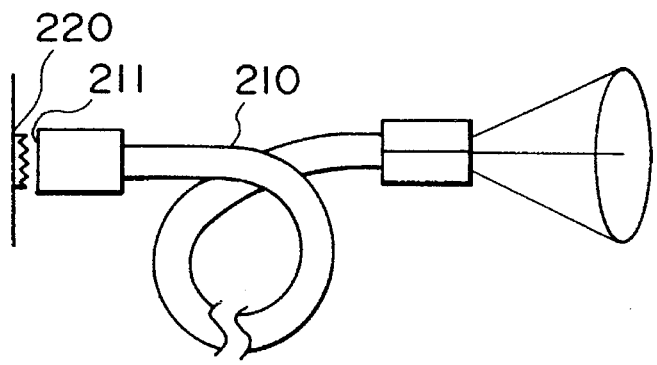
FIG. 9 is a view of an optical path, which shows the optical characteristics of the random light guide having an incident surface as a perfect diffusion surface.
Figure 10:
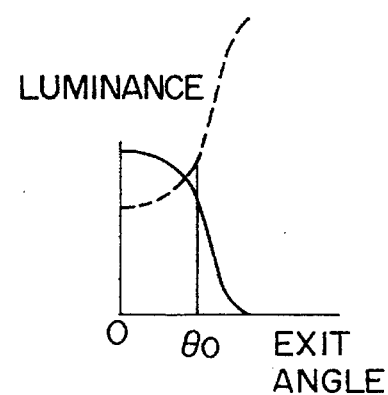
FIG. 10 is a graph showing the angular characteristics of luminance of light emerging from the light guide shown in FIG. 9.

Even in an ideal case in which a perfect diffusion surface 220 exhibiting a predetermined luminance value independently of the angle is arranged on an incident end face 211 of a random light guide 210 having the above-described optical nature (FIG. 9), the angular characteristics of luminance on the exit side are not constant and degraded toward the maximum incident angle, as indicated by a solid line in FIG. 10.

In this case, a maximum incident angle $\theta_0$ is obtained from a numerical aperture determined by the following equation:

$$\sin\theta_0 = NA_0 = \sqrt{(n1^2 - n2^2)}$$

where n1 is the refractive index of the core of the optical fiber, and n2 is the refractive index of the clad.

Figure 11:
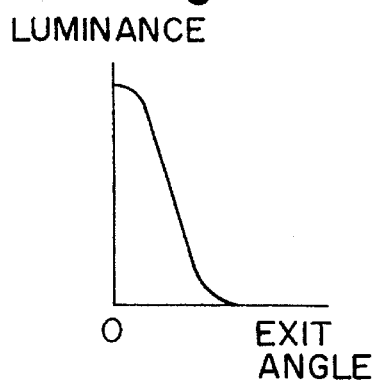
FIG. 11 is a graph showing the angular characteristics of luminance when a parallel beam is spread using a diffusion means.

Therefore, to obtain angular characteristics exhibiting a predetermined luminance up to an angle (necessary angle) according to a desired illumination field, the angular characteristics of luminance on the incident side must represent a complementary shape with respect to that indicated by the solid line in FIG. 10, i.e., angular characteristics indicated by a dotted line in FIG. 10. In the present invention, a diffusion means is used to spread the angle of the parallel beam (angular characteristics of luminance are shown in FIG. 11). At the same time, the parallel beam is caused to be incident on the incident end of the light guide with an angle. With this arrangement, angular characteristics shown in FIG. 12, which are close to the angular characteristics of luminance indicated by the dotted line in FIG. 10, can be obtained. Therefore, angular characteristics exhibiting an almost predetermined luminance up to the necessary angle can be obtained on the exit side.

More specifically, when a laser beam is to be incident on the incident end face 211 of the random light guide 210 through a diffusion plate 213 serving as a diffusion means, the incident end face 211 of the random light guide 210 is arranged to be inclined by an angle θ with respect to a plane perpendicular to a direction of incidence of the laser beam onto the diffusion plate 213. In this case, the distribution of light amounts on an exit end face 212 can be considered to be uniform because of the nature of the random light guide. For this reason, a secondary source having perfect diffusion properties equal to those of a perfect diffusion surface up to the necessary angle can be formed at the exit end of the random light guide 210. At this time, since the light amount of a portion beyond the necessary angle can be minimized, the energy loss in the entire optical system can be further decreased.

In the illumination optical system of the present invention, when an inclined parallel beam is incident from the incident side of the random light guide, as described above, the optical nature of the random light guide is utilized, i.e., the angle on the exit side is almost maintained through it is slightly diffused, and the directions are distributed at random. When the diameter of the incident laser beam is caused to coincide with that of the incident end face 211 of the random light guide, efficient energy transmission can be performed.

By using the secondary source formed in this manner, a desired illumination field having a uniform illuminance distribution and a predetermined illumination numerical aperture in the illumination field is formed by a condenser lens 214.

As described above, according to the present invention, an illumination field having a uniform illuminance distribution and a predetermined illumination numerical aperture in the illumination field can be obtained with a simple arrangement while ensuring a high degree of freedom in light guide.

Figure 15:
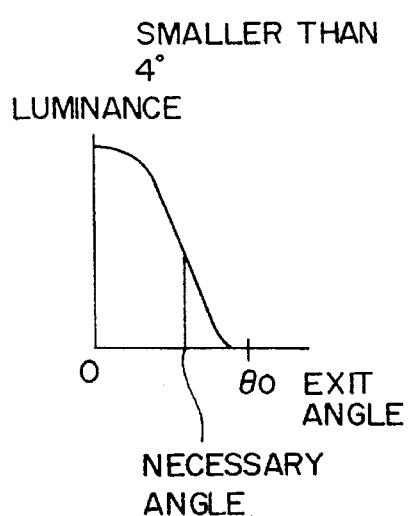
FIG. 15 is a graph showing the angular characteristics of luminance of the exit light from the light guide when an inclination angle θ is smaller than 4°.

The inclination angle θ of the incident end face of the light guide with respect to a plane perpendicular to a direction of incidence of the parallel beam onto the diffusion means preferably satisfies $4° \leq \theta \leq 10°$. When the inclination angle θ is smaller than 4°, the angular characteristics of luminance indicated by the dotted line in FIG. 10, which are complementary with the angular characteristics of luminance indicated by the solid line, cannot be obtained on the incident side because of a short of inclination. The angular characteristics of luminance at the exit end of the light guide are rapidly degraded toward the maximum incident angle, as shown in FIG. 15, so predetermined angular characteristics of luminance up to the necessary angle cannot be obtained.

Figure 16:
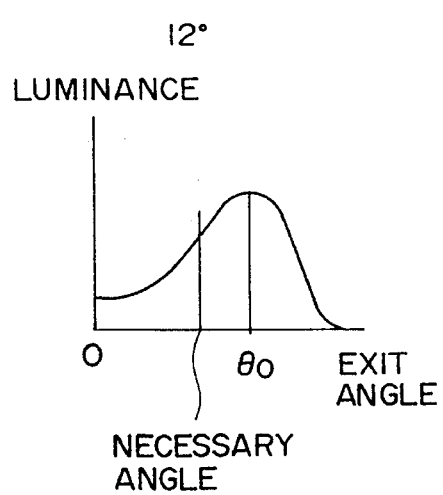
FIG. 16 is a graph showing the angular characteristics of luminance of the exit light from the light guide when the inclination angle θ is 12°.

When the inclination angle is larger than 10°, the inclination becomes too large, and the luminance is degraded within the range up to the necessary angle. FIG. 16 is a graph showing a case in which the inclination angle θ is set to 12°. The angular characteristics of luminance represent a peak value near the maximum incident angle $\theta_0$. The luminance becomes very low within the range up to the necessary angle. Therefore, when the above condition is satisfied, angular characteristics exhibiting a predetermined high luminance up to the necessary angle can be obtained at the exit end of the light guide.

The present invention will be described below in accordance with the embodiments.

(First Embodiment)

Figure 17:
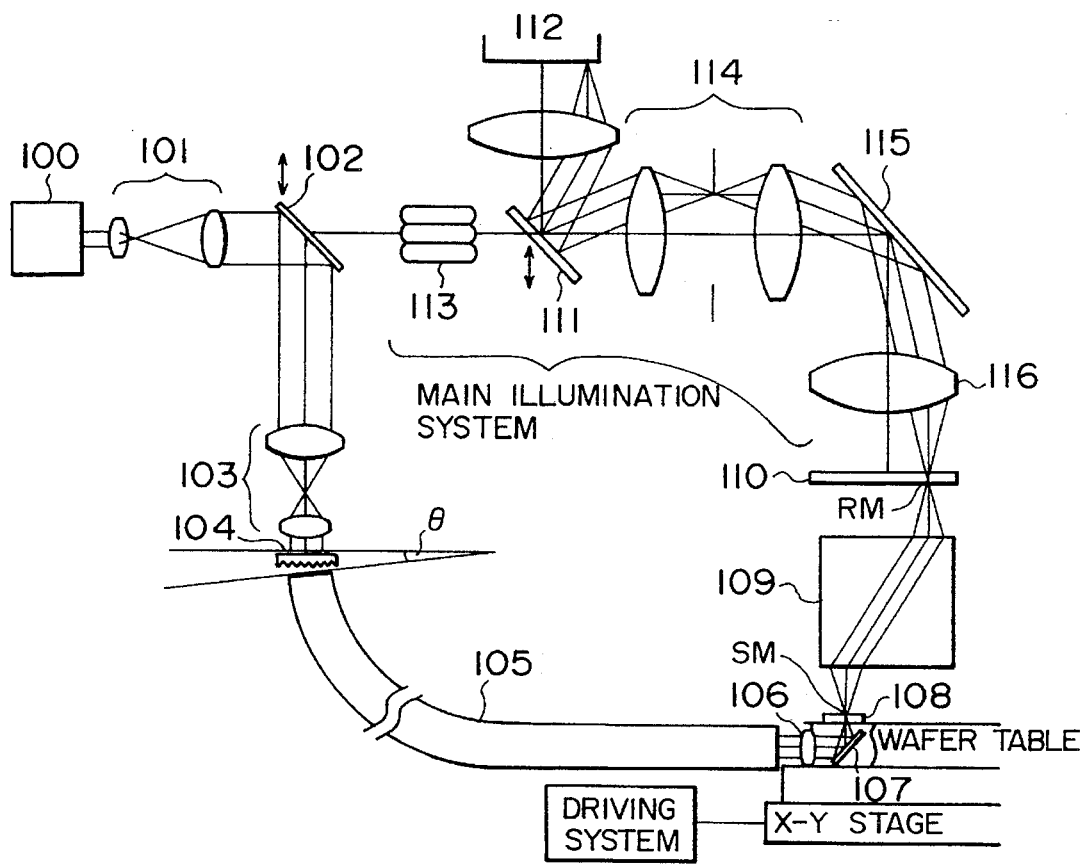
FIG. 17 is a view schematically showing a projection exposure apparatus by an ISS (image slit sensor) using the illumination optical system according to the first embodiment of the present invention as an alignment optical system.

An illumination optical system used for an ISS (Image Slit Sensor) system alignment apparatus of a projection exposure apparatus is shown in FIG. 17 as the first embodiment of the present invention. In this exposure apparatus, an exposure light beam output from an excimer laser source 100 is adjusted by a beam expander 101 into a parallel beam having an appropriate diameter and incident on a reticle 11 through a main illumination system constituted by a fly-eye integrator 113, a relay lens 114, a mirror 115, and a condenser lens 116. The exposure light beam transmitted through the reticle 110 is irradiated on a wafer (not shown) mounted on a wafer table on a stage through a projection lens 109, thereby projecting the pattern of the reticle 110 onto the wafer surface.

The alignment apparatus of this embodiment, which detects the position coordinates of the reticle 110, commonly uses the excimer laser source 100 for exposure. In an alignment operation, a switching mirror 102 is inserted between the laser source 100 side and the main illumination system, thereby guiding the laser beam from the light source to the illumination optical system of the alignment apparatus. The illumination optical system is constituted by a diffusion plate 104, a random light guide 105, and a condenser lens 106.

In the above arrangement, the laser beam from the excimer laser source 100 is reflected by the switching mirror 102 through the beam expander 101 and incident on the alignment illumination optical system. In the illumination optical system, the parallel beam adjusted to have an appropriate diameter by a beam expander 103 is diffused by the diffusion plate 104 and incident on the random light guide 105. At this time, the incident end face of the random light guide 105 is arranged to have a predetermined inclination angle θ with respect to a plane perpendicular to the direction of incidence of the parallel beam onto the diffusion plate 104. In this case, the parallel beam is perpendicularly incident on the surface of the diffusion plate 104. The incident end face of the random light guide 105 is arranged to be inclined by θ=about 7° with respect to the surface of the diffusion plate 104.

Figure 12:
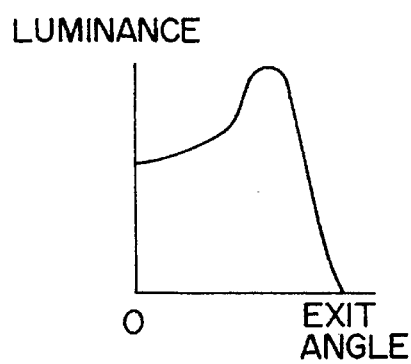
FIG. 12 is a graph showing the angular characteristics of luminance of the incident light when the light beam spread by the diffusion means is obliquely incident on the light guide.
Figure 13:
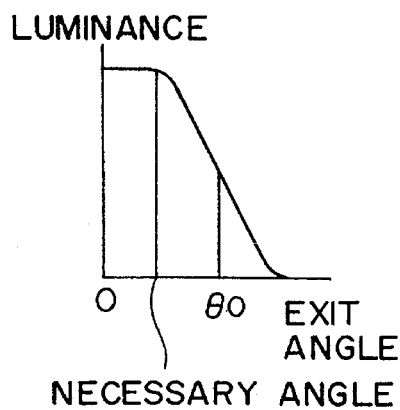
FIG. 13 is a graph showing the angular characteristics of luminance of the exit light when the light beam spread by the diffusion means is obliquely incident on the light guide.
Figure 14:
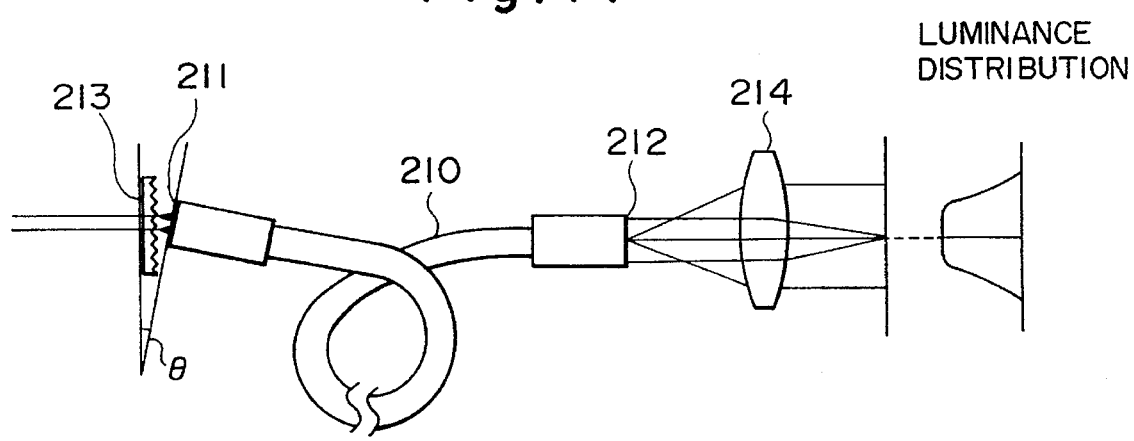
FIG. 14 is a view schematically showing the function of the illumination optical system according to the present invention.

With this arrangement, the angular characteristics of luminance shown in FIG. 12 can be obtained at the incident end of the random light guide 105. The light beam emerges from the exit end with predetermined angular characteristics exhibiting a predetermined luminance up to the necessary angle, as shown in FIG. 13. The illumination light emerging from the random light guide 105 forms a secondary source and illuminates a mark SM on an index plate 108 arranged at the same position as the wafer surface on the stage (on the image formation surface of the projection lens 109) from the inside of the stage with a uniform illuminance distribution in an appropriate illumination field through a mirror 107.

In this embodiment, the mark SM is a transparent slit. When this mark SM is illuminated from the lower side, illumination light emerges from the slit. A reticle mark RM is arranged on the reticle 110 which is located at a position conjugate with the index plate 108 with respect to the projection lens 109 telecentric on both sides. This mark RM is also a transparent slit.

When the reticle 110 optically overlaps the index plate 108 on the stage through the projection lens 109, the light beam from the mark SM is transmitted through the projection lens 109 and then the reticle mark RM and reversely guided through the main illumination system for exposure. The light beam is guided to a detection optical system along the optical path deflected by a switching mirror 111 (inserted into the optical path only during alignment) and is detected by a detector (photomultiplier tube) 112.

Figure 18:
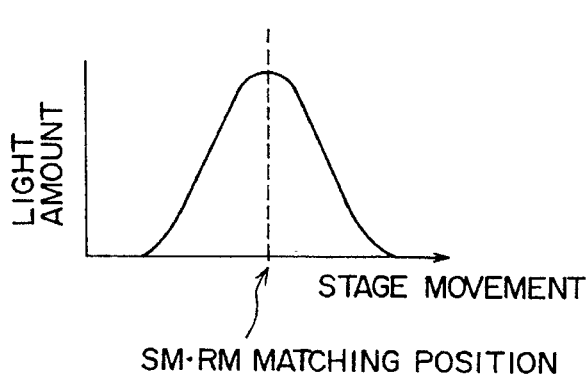
FIG. 18 is a graph showing a matched state between a mark SM on the index plate and a reticle mark RM in the projection exposure apparatus shown in FIG. 17.

When the reticle mark RM and the mark SM are relatively moved in accordance with the movement of the stage, the light amount to be detected by the detector 112 changes (FIG. 18). The driving system is controlled to move the stage such that the detection light amount is maximized, i.e., the reticle mark RM and the mark SM overlap each other through the projection lens 109. The stage coordinates at a position where the detection light amount is maximized can be obtained by an interferometer or the like.

Figure 19:
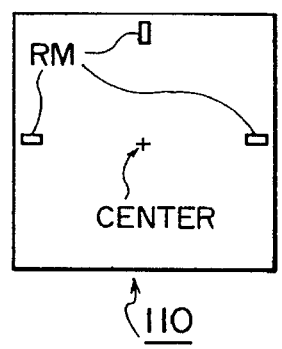
FIG. 19 is a view showing an example of the reticle mark RM.

As shown in FIG. 19, when a plurality (three in this case) of reticle marks RM are arranged at positions separated from the reticle center on the reticle 110 by a predetermined distance, and the stage coordinates are measured for each reticle mark RM, the stage conversion coordinates of the reticle center can be obtained. To obtain the same degree of spreading of the light beam in the projection lens 109 as in an exposure operation, the illumination numerical aperture by the alignment illumination optical system is preferably equalized with that converted on the wafer of the main illumination system for exposure from the viewpoint of precision.

(Second Embodiment)

Figure 20:
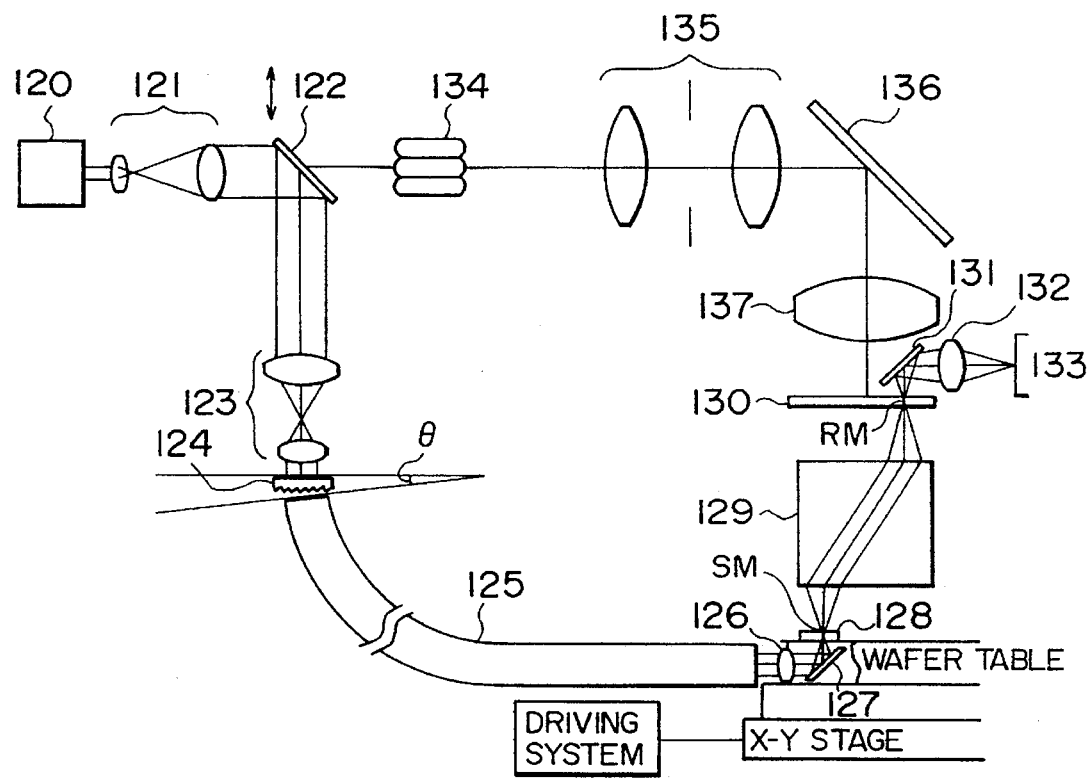
FIG. 20 is a view schematically showing a projection exposure apparatus using an illumination optical system according to the second embodiment of the present invention for an alignment optical system to perform reticle alignment.

An illumination optical system used for a reticle alignment system alignment apparatus of a projection exposure apparatus is shown in FIG. 20 as the second embodiment of the present invention. This exposure optical system is the same as that of the first embodiment. An exposure light beam output from an excimer laser source 120 is adjusted by a beam expander 121 into a parallel beam having an appropriate diameter and incident on a reticle 130 through a main illumination system constituted by a fly-eye integrator 134, a relay lens 135, a mirror 136, and a condenser lens 134. The exposure light beam transmitted through the reticle 130 is irradiated on a wafer (not shown) mounted on a wafer table on a stage through a projection lens 129, thereby projecting the pattern of the reticle 130 onto the wafer surface.

The alignment apparatus of this embodiment, which performs alignment of the reticle 130, commonly uses the excimer laser source 120 for exposure. In an alignment operation, a switching mirror 122 is inserted between the laser source 120 side and the main illumination system, thereby guiding the laser beam from the light source to the illumination optical system of the alignment apparatus. The illumination optical system is constituted by a diffusion plate 124, a random light guide 125, and a condenser lens 126.

In the above arrangement, the laser beam from the excimer laser source 120 is reflected by the switching mirror 122 through the beam expander 121 and incident on the alignment illumination optical system. In the illumination optical system, the parallel beam adjusted to have an appropriate diameter by a beam expander 123 is diffused by the diffusion plate 124 and incident on the random light guide 125. At this time, the incident end face of the random light guide 125 is arranged to have a predetermined inclination angle θ with respect to a plane perpendicular to the direction of incidence of the parallel beam onto the diffusion plate 124. In this case, the parallel beam is perpendicularly incident on the surface of the diffusion plate 124. The incident end face of the random light guide 125 is arranged to be inclined by θ=about 7° with respect to the surface of the diffusion plate 124.

With this arrangement, the angular characteristics of luminance shown in FIG. 12 can be obtained at the incident end of the random light guide 125. The light beam emerges from the exit end with predetermined angular characteristics exhibiting a predetermined luminance up to the necessary angle, as shown in FIG. 13. The illumination light emerging from the random light guide 125 forms a secondary source and illuminates a mark SM on an index plate 128 arranged at the same position as the wafer surface on the stage (on the image formation surface of the projection lens 129) from the inside of the stage with a uniform illuminance distribution in an appropriate illumination field through a mirror 127.

Figure 21:
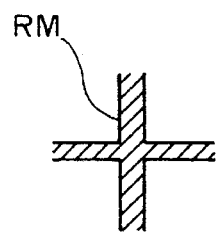
FIG. 21 is a view showing a transparent cross reticle mark RM used in the projection exposure apparatus shown in FIG. 20.

A transparent mark SM is formed on the index plate 128. When this mark SM is illuminated from the lower side, illumination light emerges therefrom. A transparent cross reticle mark RM as shown in FIG. 21 is arranged on the reticle 130 which is located at a position conjugate with the index plate 128 with respect to the projection lens 129 telecentric on both sides.

When the reticle 130 is at a predetermined position with respect to the index plate 128 on the stage, light from the mark SM is transmitted through the reticle mark RM through the projection lens 129, and the optical path is deflected by a mirror 131 arranged to be inclined by 45°. The light beam is incident on a CCD camera 133 through an objective lens 132, and image detection of the reticle mark RM is performed. On the basis of the image detection result, alignment can be performed such that the center of the reticle mark RM is located at the center of the optical axis of the objective lens 132.

Figure 22:
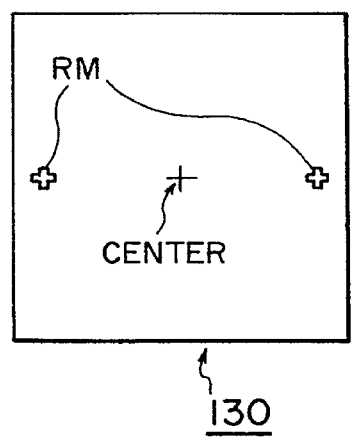
FIG. 22 is a view showing an example of the reticle mark RM.

As shown in FIG. 22, for each reticle used in this exposure apparatus, a reticle mark with respect to the reticle center is standardized. In this case, even when the reticle is exchanged, the reticle position can be reproduced such that the reticle center is always located at the same position. To form a satisfactory image intensity distribution when the image of the reticle mark RM is focused on the light-receiving surface of the CCD camera 133, an appropriate illumination numerical aperture by the illumination system is required.

Figure 23:
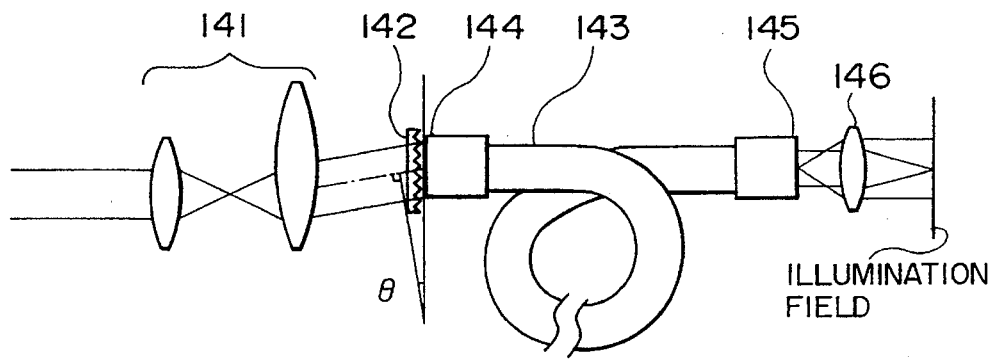
FIG. 23 is a view schematically showing a modification of the illumination optical system according to the first or second embodiment.

In the illumination optical system of the first or second embodiment, the parallel beam is perpendicularly incident on the diffusion plate surface, and the incident end face of the random light guide is arranged to be inclined by the predetermined angle θ with respect to the diffusion plate surface. FIG. 23 is a view showing a modification of the illumination optical system using another method in which the incident end face of the random light guide is arranged to be inclined by the predetermined inclination angle θ with respect to a plane perpendicular to the direction of incidence of the parallel beam.

An incident end face 144 of a random light guide 143 is arranged to be parallel to the surface of a diffusion plate 142. A parallel beam supplied from a light source is incident to be inclined by a predetermined angle with respect to a direction perpendicular to the surface of the diffusion plate 142 through a Keplerian relay lens system 141. In this case, the lens of the Keplerian relay lens system 141 on the light source side is eccentrically arranged with respect to the lens on the diffusion plate 142 side, thereby inclining the exit direction of the light beam from the Keplerian relay lens system 141 with respect to the incident direction to the relay lens system.

Therefore, the illumination light has angular characteristics of luminance as shown in FIG. 13 at an exit end 145 of the random light guide 143 to form an appropriate illumination field having a uniform illuminance distribution through a condenser lens 146.

Figure 24:
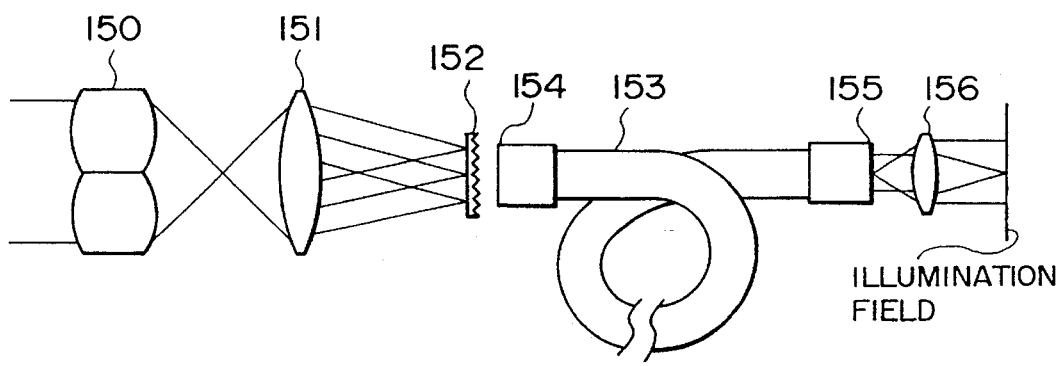
FIG. 24 is a view schematically showing another modification of the illumination optical system according to the first or second embodiment.

FIG. 24 is a view showing another modification of the illumination optical system. As in FIG. 23, an incident end face 154 of a random light guide 153 is arranged to be parallel to the surface of a diffusion plate 152. In place of the eccentric lens on the light source side in FIG. 23, a fly-eye lens 150 (four-lens structure) is used to incline the exit direction of the light beam from a lens 151 with respect to the incident direction to the fly-eye lens 150. More specifically, the incident direction to the diffusion plate 152 is inclined with respect to a direction perpendicular to the diffusion plate 152. Because of its effect for eliminating variations in light amount on the incident end face 154 of the random light guide 153, this illumination optical system has a higher resistance to variations in illuminance of an incident laser beam.

In the illumination field formed by the above illumination optical system, the diffusion effect of the diffusion plate and the angular diffusion effect of the random light guide are provided. In addition, the positional relationship on the incident side by the random arrangement of the optical fibers in the random light guide is not maintained. Because of the synergistic effect of these effects, no speckle or interference fringe is generated particularly when an excimer laser which is not so good in coherency is used.

Figure 25:
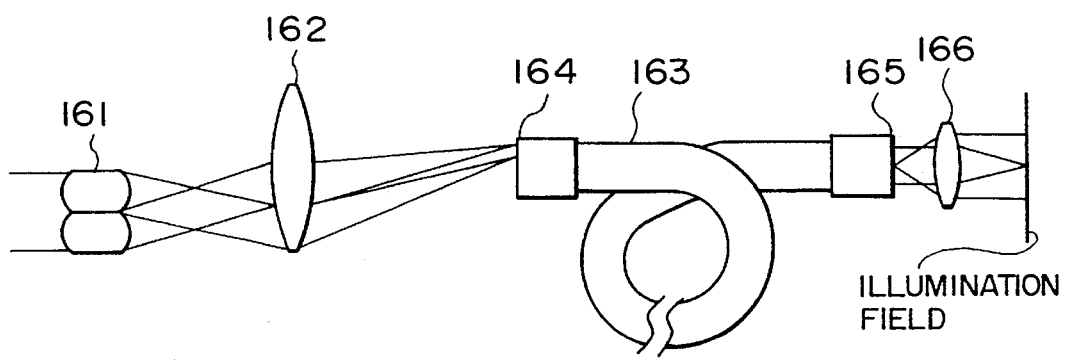
FIG. 25 is a view schematically showing an illumination optical system applied with part of the illumination optical system of the present invention.

FIG. 25 is a view showing, as a reference, an illumination optical system for mainly obtaining a desired illumination field by only the angular diffusion effect of a random light guide 163. In this case, a fly-eye lens 161 is used as a diffusion means on the incident side. However, since the angular characteristics are not spread by the diffusion plate unlike the above embodiments, angular characteristics exhibiting a predetermined luminance up to a necessary angle, as shown in FIG. 13, cannot be obtained. For this reason, this system is slightly disadvantageous in illuminance variations of the illumination field. Such an illumination optical system can be used when angular characteristics of predetermined luminance are not so strictly required. In this case, a relay lens system may be used in place of the fly-eye lens 161.

In each of the above embodiments, the diffusion plate is used as a diffusion means. However, the present invention is not limited to this. A phase grating or a diffuser can also be used as far as it has a diffusion effect. Any diffusion plate can be used as far as it can obtain the illuminance distribution shown in FIG. 11, and ground glass or a lemon skin filter which is chemically treated can also be used. In addition, in each of the above embodiments, the illumination optical system for the alignment apparatus of a projection exposure apparatus has been described. The illumination optical system according to the present invention can also be used for another optical system, and particularly for an optical system using a light source with a small illumination numerical aperture, such as an excimer lasers and requiring the degree of freedom for supplying light.

An embodiment of an alignment apparatus according to the present invention will be described below.

Figure 26:
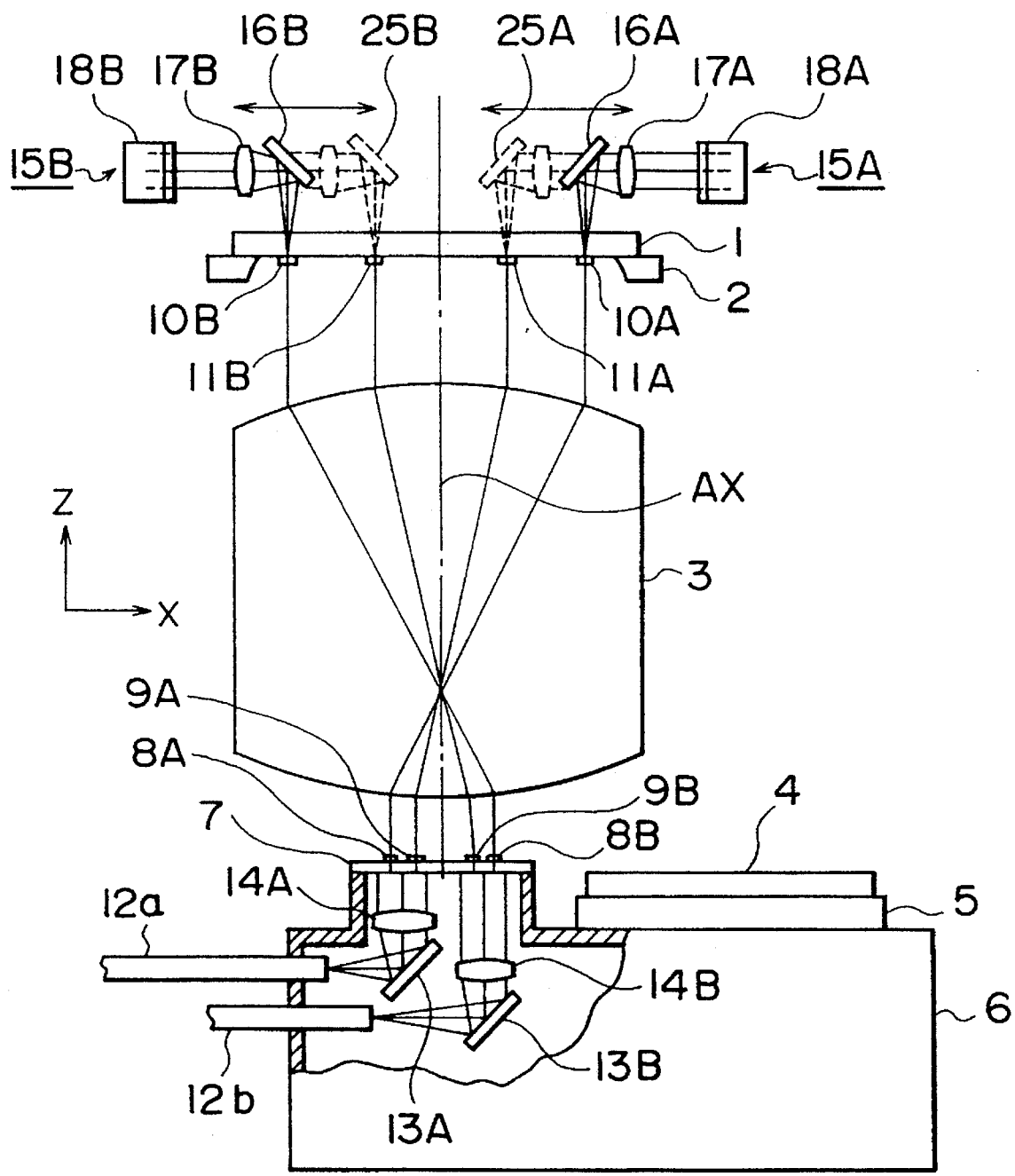
FIG. 26 is a view showing the main part of a general projection exposure apparatus.

FIG. 26 is a view showing the main part of a projection exposure apparatus having a stage light emission type reticle alignment system and a reticle position detection system. Referring to FIG. 26, a reticle 1 is held on a reticle stage 2. The pattern of the reticle 1 is projected and exposed in each shot area on a wafer 4 through a projection optical system 3 with continuously emitted exposure light (not shown) (e.g., the i-ray or g-ray). In this case, the Z-axis is set to be parallel to an optical axis AX of the projection optical system 3, and the X- and Y-axes are respectively set in directions parallel and perpendicular to the sheet surface of FIG. 26 within a plane perpendicular to the optical axis AX. Cross reticle marks 10A and 10B are formed at the two ends of the pattern area of the reticle 1 along the X direction. Reticle alignment systems 15A and 15B are arranged above the reticle marks 10A and 10B, respectively.

Figure 27:
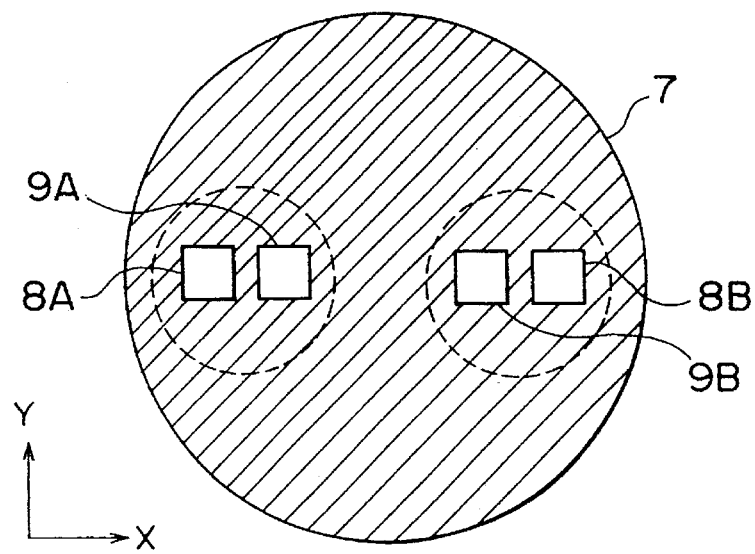
FIG. 27 is a plan view showing a reference mark provided on a stage substrate of the projection exposure apparatus shown in FIG. 26.

The wafer 4 is mounted on a wafer stage 6 through a wafer holder 5. The wafer stage 6 is constituted by an X–Y stage for positioning the wafer 4 in an X–Y plane, a Z stage for positioning the wafer 4 in the Z direction, a leveling stage for correcting the inclination angle of the wafer 4, and the like. The X- and Y-coordinates of the wafer stage 6 are always measured by laser interferometers (not shown), respectively. A transparent stage base 7 is attached near the wafer holder 5 on the wafer stage 6. In the light-shielding film on the upper surface of the stage base 7, a pair of reference marks 8A and 9A and a pair of reference marks 8B and 9B each constituted by a rectangular opening are formed in two areas which are, e.g., symmetrical with each other about the center along the X-axis, as shown in FIG. 27.

Referring back to FIG. 26, in reticle alignment, the reference marks 8A and 9A, and 8B and 9B are illuminated from the bottom surface side by the stage light emission type illumination system. The illumination light beams passing through the reference marks 8A and 8B respectively illuminate reticle marks 10A and 10B on the lower surface of the reticle 1 through the projection exposure system 3. Depending on the specifications of the projection area of the projection optical system to be used, inner reticle marks (to be referred to as reticle marks 11A and 11B) are used in some cases. For this reason, the illumination light beams passing through the reference marks 9A and 9B respectively illuminate the reticle marks 11A and 11B through the projection optical system 3. More specifically, when the center of the stage base 7 matches the optical axis AX, the reference marks 8A and 8B are almost conjugate with the reticle marks 10A and 10B, and the reference marks 9A and 9B are almost conjugate with the reticle marks 11A and 11B.

In the stage light emission type illumination system, continuously emitted illumination light in the same wavelength band as that of the exposure light guided by the light guide from an exposure light source (not shown) emerges from exit ends 12a and 12b of the light guide into the wafer stage 6. The illumination light emerging from the exit end 12a is vertically reflected upward by a mirror 13A to illuminate the reference marks 8A and 9A through a condenser lens 14A. Similarly, the illumination light emerging from the exit end 12b illuminates the reference marks 8B and 9B through a mirror 13B and a condenser lens 14B. At this time, when the center of the stage base 7 matches the optical axis AX, the images of the reference marks 8A, 8B, and the like are formed to surround the reticle marks 10A, 10B, and the like because the illumination light is in the same wavelength band as that of the exposure light. The reticle marks are illuminated by these images. The stage light emission type illumination system has the above-described arrangement.

Figure 28:
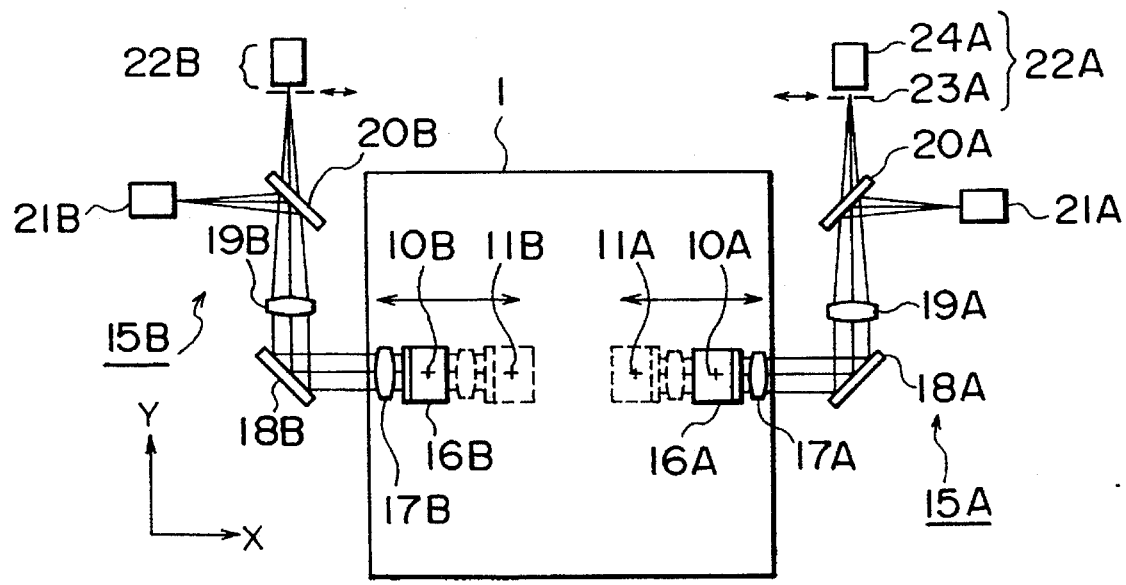
FIG. 28 is a plan view showing a reticle alignment system of the projection exposure apparatus shown in FIG. 26.

FIG. 28 is a plan view showing the reticle alignment system in FIG. 26. In a reticle alignment system 15A on the right side of FIG. 28, the illumination light transmitted through the periphery of the reticle mark 10A (or 11A) on the reticle 1 is reflected by a mirror 16A for deflecting the optical path and incident on a half mirror 20A through a first objective lens 17A, a mirror 18A, and a second objective lens 19A. The light beam reflected by the half mirror 20A forms a synthetic image of the reference mark 8A and the reticle mark 10A on the image pickup surface of a two-dimensional image pickup element 21A consisting of a two-dimensional CCD or the like. Misalignment of the reticle mark 10A is detected by, e.g., visual observation using the reference mark 8A as an index mark from two-dimensional image data from the two-dimensional image pickup element 21A. In addition, when image processing of the two-dimensional image data is performed, the positional shift is detected as those of the X- and Y-coordinates on the wafer stage.

The light beam transmitted through the half mirror 20A forms the image of the reticle mark 10A subjected to transmission illumination with the illumination light using the image of the reference mark 8A as an illumination field on a vibration slit 23A in a two-dimensional photoelectric microscope 22A.

A Y-axis photoelectric microscope in the two-dimensional photoelectric microscope 22A is constituted by the vibration slit 23A vibrating in a direction corresponding to the Y direction on the image surface of the reticle mark 10A, and a photoelectric detector 24A such as a photomultiplier arranged immediately subsequent to the vibration slit. When an output signal from the photoelectric detector 24A is synchronously rectified by a driving signal of the vibration slit 23A, a signal corresponding to the Y-direction shift of the reticle mark 10A with respect to a predetermined reference position fixed with respect to the reticle stage 2 can be obtained. Although not illustrated, an X-axis photoelectric microscope constituted by a vibration slit vibrating in a direction corresponding to the X direction on the image surface of the reticle mark 10A, and a photoelectric detector arranged immediately subsequent to the vibration slit is also included in the photoelectric microscope 22A. With this X-axis photoelectric microscope, the X-direction positional shift of the reticle mark 10A from a predetermined reference position can be detected, A reticle alignment system 15B on the left side is also constituted by a mirror 16B to a two-dimensional photoelectric microscope 22B to be symmetrical with the right-side alignment system. The positional shift of the reticle mark 10B can be detected by a two-dimensional image pickup element 21B of the reticle alignment system 15B by using the other reference mark 8B as an index mark. At the same time, the X- and Y-direction shifts of the reticle mark 10B from a predetermined reference position can be detected by the photoelectric microscope 22B.

As a result, when image pickup signals from the two two-dimensional image pickup elements 21A and 21B are processed, the positional relationship of the reticle 1 with respect to the wafer stage 6 (two-dimensional shift and a rotation angle) can be obtained. In addition, the two-dimensional shifts of the two reticle marks 10A and 10B can be detected by the two photoelectric microscopes 22A and 22B. For this reason, the X- and Y-direction shifts and the rotation angle of the reticle 1 with respect to the reticle stage 2 can be obtained. When each of the X- and Y-direction shifts and the rotation angle falls within an allowance, reticle alignment is completed.

When the inner reticle marks 11A and 11B of the reticle 1 are to be used in accordance with the projection area of the projection optical system 3 to be used, the first objective lens 17A and the mirror 16A are moved together in the −X direction. At the same time, a first objective lens 17B and the mirror 16B are moved together in the +X direction. With this operation, the mirrors 16A and 16B must be located above the reticle marks 11A and 11B.

At this time, as disclosed in Japanese Patent Laid-Open No. 57-142612, the lower surface (pattern surface) of the reticle 1 is located on the image formation planes of the first objective lenses 17A and 17B through the mirrors 16A and 16B. Even when the mirrors 16A and 16B and the first objective lenses 17A and 17B are moved in the X direction along the reticle 7, the lower surface of the reticle 1 always match the image formation planes of the first objective lenses 17A and 17B. According to this arrangement, a parallel system is always formed between the first objective lens 17A (or 17B) and the second objective lens 19A (or 19B). Regardless of the above movement, the conjugate relationship between the pattern surface of the reticle 1 and the two-dimensional image pickup element, and the vibration slit of the two-dimensional photoelectric microscope, and the magnification are maintained. Therefore, the reticle alignment system 15A and 15B can cope with use of the reticle marks 11A and 11B, and the reference marks 9A and 9B.

As described above, in the reticle alignment system shown in FIG. 26, the stage light emission type illumination system using continuously emitted illumination light in the same wavelength band as that of the exposure light is used to illuminate the reference marks and the reticle marks. For this reason, position detection is accurately performed by both the two-dimensional image pickup elements 21A and 21B and the photoelectric microscopes 22A and 22B.

To cope with a further improvement of the degree of integration of a semiconductor element or the like, a projection exposure apparatus which uses exposure light having a shorter wavelength to improve the resolution has also been used in recent years. As current exposure light having a short wavelength as in the far-ultraviolet range, an excimer laser beam such as a KrF excimer laser beam (wavelength: 248 nm) and an ArF excimer laser beam (wavelength: 193 nm), a metal vapor laser beam, or a light beam such as a pulsed harmonic of a YAG laser is mainly used.

However, assume that the reference marks and the reticle marks are illuminated by the stage light emission method using pulsed illumination light branched from pulsed exposure light. In this case, no high-quality signal can be obtained when the detection signal is synchronously rectified by the driving signal of the vibration slit in the photoelectric microscope 22A or 22B. Therefore, reticle alignment by the photoelectric microscopes 22A and 22B is not accurately performed.

(Third Embodiment)

An embodiment of an alignment apparatus according to the present invention will be described below with reference to FIGS. 29 to 33. In this embodiment, the present invention is applied to the reticle alignment system of a projection exposure apparatus using, as exposure light, a pulsed far-ultraviolet beam. The same reference numerals as in FIGS. 26 to 28 denote the same elements in FIGS. 29 to 30, and a detailed description thereof will be omitted.

Figure 30:
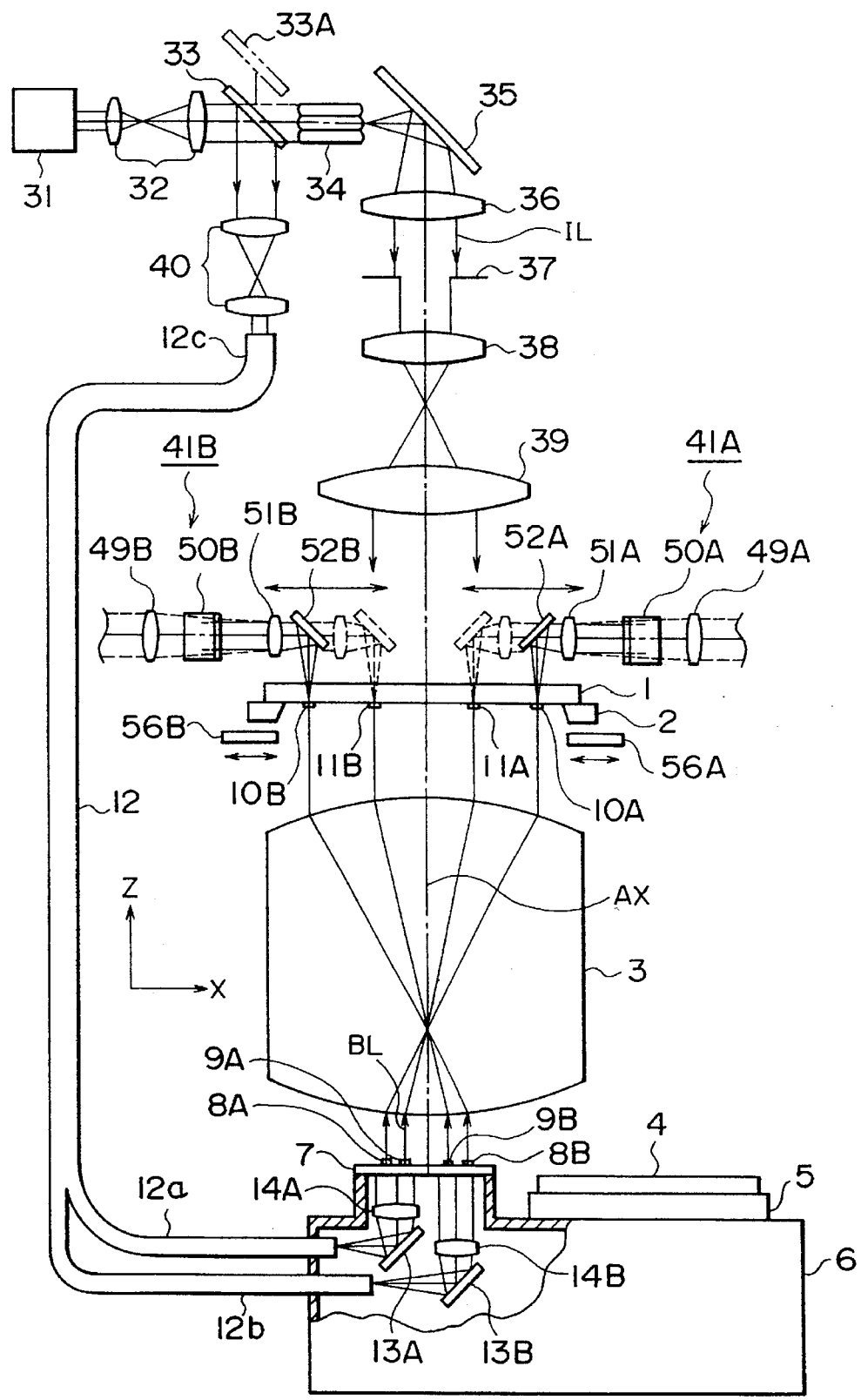
FIG. 30 is a view showing the entire projection exposure apparatus shown in FIG. 29.

FIG. 30 is a view showing the projection exposure apparatus of the present invention. Referring to FIG. 30, exposure light in the far-ultraviolet range (e.g., wavelength: 248.4 nm) is pulsed and emitted from a pulse light source 31 consisting of, e.g., a KrF excimer laser source. The sectional shape of the pulsed exposure light beam (pulse exposure light) is spread by a beam expander 32, and the light beam is incident on a fly-eye lens 34. In this embodiment, a mirror 33 for switching the optical path is arranged to be inclined by 45° with respect to the optical axis and freely inserted between the beam expander 32 and the fly-eye lens 34. During exposure, the mirror 33 is retreated to a position 33A. During reticle alignment, the mirror 33 is set in the optical path of the exposure light.

In the exposure operation, a pulse exposure light beam IL from a secondary source formed on the rear-side (reticle-side) image formation plane of the fly-eye lens 34 is reflected by a mirror 35 and illuminates the pattern area of the lower surface (pattern surface) of a reticle 1 with a uniform illuminance distribution through a first relay lens 36, a variable field stop (reticle blind) 37, a second relay lens 38, and a main condenser lens 39. With the pulse exposure light beam IL, the pattern image of the reticle 1 is projected and exposed on each shot area of a wafer 4 on a wafer stage 6 through a projection optical system 3.

On the other hand, in reticle alignment, the mirror 33 is set in the optical path of the pulse exposure light beam. The light beam (to be referred to as a pulse illumination light beam hereinafter) reflected by the mirror 33 is supplied to an incident end 12c of a light guide 12 through a beam expander 40 for reducing the beam diameter. Two exit ends 12a and 12b of the light guide 12 are inserted in the wafer stage 6. Pulse illumination light beams BL emerging from the exit ends 12a and 12b illuminate reference marks 8A and 9A, and 8B and 9B each constituted by a rectangular opening and formed in the upper surface of a stage base 7 through mirrors 13A and 13B and condenser lenses 14A and 14B, respectively. When the center of the stage base 7 almost matches an optical axis AX of the projection optical system 3, the pulse illumination light beams BL passing through the reference marks 8A and 9A, and 8B and 9B form the images of the reference marks near reticle marks 10A and 11A, and 10B and 11B on the pattern surface of the reticle 1 through the projection optical system 3, respectively. In FIG. 30, reticle alignment systems 41A and 41B are arranged above the reticle marks 10A and 10B, respectively.

Figure 29:
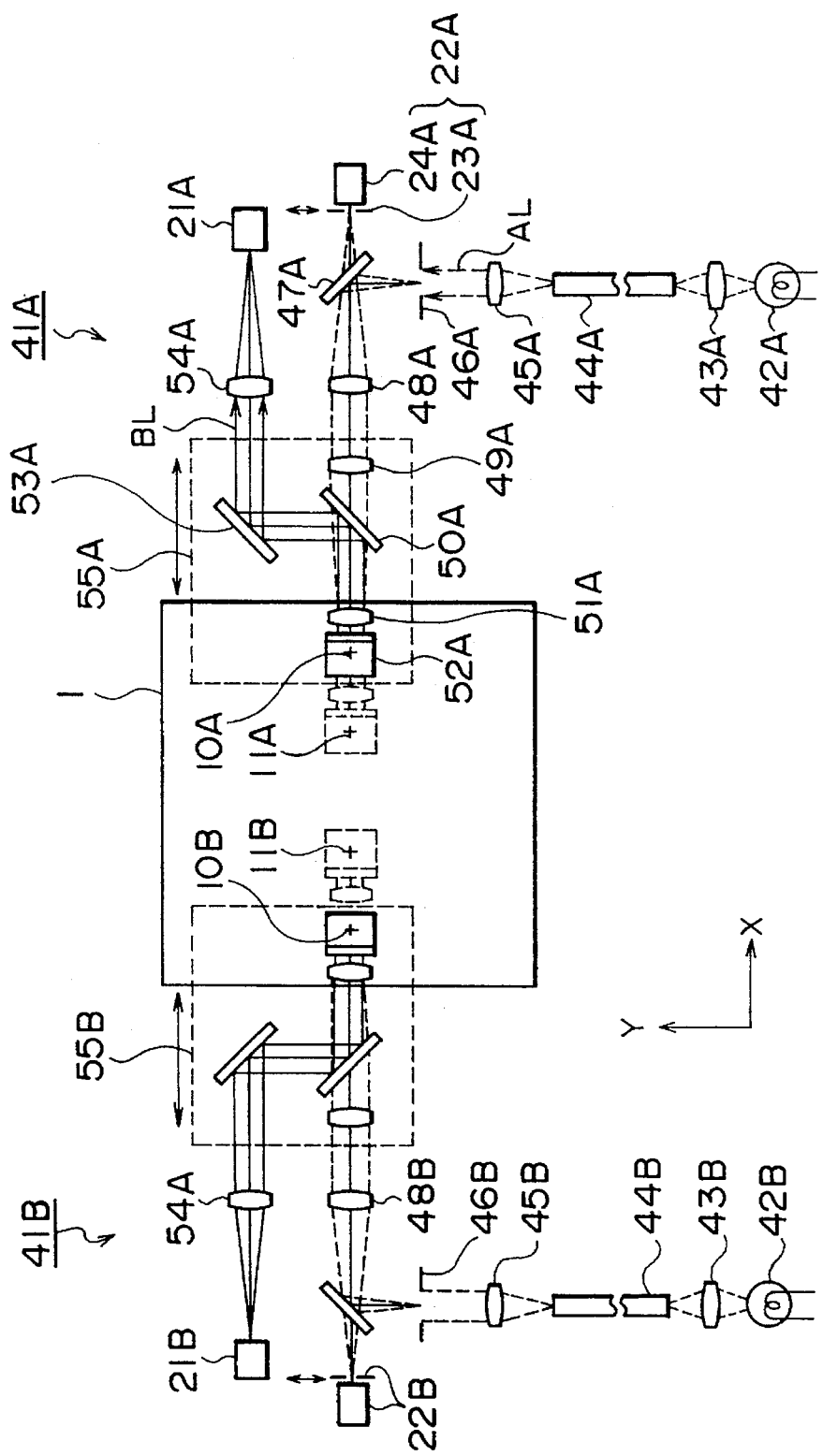
FIG. 29 is a plan view showing the reticle alignment system of the projection exposure apparatus to which an alignment apparatus according to an embodiment of the present invention is applied.

FIG. 29 is a plan view showing the reticle alignment systems of this embodiment. In the reticle alignment system 41A on the right side of FIG. 29, a continuous light beam (to be referred to as a "continuous illumination light beam" hereinafter) AL in a wavelength range (e.g., red or near-infrared light) different from that of the pulse exposure light beam IL is selected from light continuously emitted from a halogen lamp 42A by an optical filter (not shown). A light-emitting diode or the like can also be used in place of the halogen lamp 42A. The continuous illumination light beam AL is irradiated on the opening of a field stop 46A through a condenser lens 43A, a light guide 44A, and a condenser lens 45A, as indicated by a dotted line.

The continuous illumination light beam AL passing through the opening of the field stop 46A is reflected by a half mirror 47A and incident on a dichroic mirror 50A through a second objective lens 48A and a correction lens 49A. The dichroic mirror 50A has wavelength selection properties for reflecting the pulse illumination light beam BL and transmitting the continuous illumination light beam AL. Therefore, the continuous illumination light beam AL is transmitted through the dichroic mirror 50A and illuminates the reticle mark 10A through a first objective lens 51A and a mirror 52A.

Referring to FIG. 30, movable mirrors 56A and 56B are arranged on the bottom surface side of a reticle stage 2. The movable mirrors 56A and 56B are supported to be movable along the lower surface of the reticle 1. If the reflectance of the reticle mark 10A or 10B is low, the movable mirrors 56A and 56B are arranged below the reticle marks 10A and 10B, respectively. At this time, the movable mirror 56A is arranged on a plane conjugate with the arrangement plane of the field stop 46A in FIG. 29. The reason for this will be described later in detail.

The continuous illumination light beam AL reflected by the reticle mark 10A, the continuous illumination light beam AL reflected by the movable mirror 56A in the set state and passing through the periphery of the reticle mark 10A, and the pulse illumination light beam BL passing through the periphery of the reticle mark 10A are guided to the dichroic mirror 50A through the mirror 52A and the first objective lens 51A. Referring back to FIG. 30, the pulse illumination light beam BL is reflected by the dichroic mirror 50A and forms the images of the reference mark 8A and the reticle mark 10A on the image pickup surface of a two-dimensional image pickup element 21A constituted by a two-dimensional CCD or the like through a mirror 53A and a second objective lens 54A. On the other hand, the continuous illumination light beam AL is transmitted through the dichroic mirror 50A and forms the image of the reticle mark 10A on a vibration slit 23A of a two-dimensional photoelectric microscope 22A trough the correction lens 49A, the second objective lens 48A, and the half mirror 47A. Although not illustrated, a vibration slit having a vibration direction perpendicular to that of the vibration slit 23A and an immediately subsequent photoelectric detector are also included in the photoelectric microscope 22A.

When an image pickup signal from the two-dimensional image pickup element 21A is processed, the X- and Y-direction shifts of the reticle mark 10A with respect to the reference mark 8A are measured. Additionally, the X- and Y-direction shifts of the reticle mark 10A with respect to the reference point (reticle stage 2) in the photoelectric microscope 22A are measured by the two-dimensional photoelectric microscope 22A. A movable optical system 55A constituted by the correction lens 49A to the mirror 53A is arranged to be movable in the X direction. When position of, e.g., the reticle mark 10A is to be detected, the movable optical system 55A moves such that the mirror 52A is located above the reticle mark 11A.

If the pulse illumination light beam BL is a light beam branched from the exposure light from the KrF excimer laser source for pulsing light in the far-ultraviolet range (e.g., wavelength: 248.8 nm), the glass material usable for the pulse illumination light beam BL is limited. For this reason, when the lower surface of the reticle 1 matches the image formation plane of the first objective lens 51A for the pulse illumination light beam BL, the focal point of the first objective lens 51A is located below the reticle 1 for the continuous illumination light beam AL having a longer wavelength. In this state, a parallel system is formed between the first objective lens 51A and the second objective lens 54A for the pulse illumination light beam BL while a divergence system is formed between the first objective lens 51A and the second objective lens 48A for the continuous illumination light beam AL as nonexposure light.

To prevent this, the correction lens 49A for correcting the focal point of the first objective lens 51A for the continuous illumination light beam AL to be on the lower surface of the reticle 1 is arranged on the optical path of the continuous illumination light beam AL transmitted through the dichroic mirror 50A, thereby moving the first objective lens 51A and the correction lens 49A together. Therefore, a parallel system is formed between the correction lens 49A and the second objective lens 48A. Even when the movable optical system 55A moves in the X direction as indicated by the dotted line in FIG. 29, the conjugate relationship between the lower surface of the reticle 1 and the vibration slit of the photoelectric microscope 22A and the focusing magnification are maintained in the initial state. Therefore, even the reticle mark 11A at a different position can also be accurately measured.

The reticle alignment system 41B on the left side is also constituted by a halogen lamp 42B to a second objective lens 54A, a two-dimensional image pickup element 21B, and a photoelectric microscope 22B to be symmetrical with the right-side alignment system. The positional relationships of the reticle marks 10B and 11b with respect to the reticle stage 2, and the positional relationships of the reticle marks 10B and 11B with respect to the reference marks 8B and 9B are measured by the reticle alignment system 41B.

The function of the movable mirror 56A in FIG. 30 will be described below. When incident illumination is used for the continuous illumination light beam AL, as in this embodiment, the reflectance of the reticle mark 10A or 11A always poses a problem. In this embodiment, however, the problem caused by the reflectance is solved by the following method. A pattern obtained when a chromium film formed on a glass substrate is etched to leave a cross mark-like chromium film is normally used as the reticle mark 10A or 11A. There are some patterns whose reflectance for a light beam incident from the upper surface is lower than that of the normal pattern (reflectance: about 40%).

When the circuit pattern in the pattern area of the reticle 1 has such a low reflectance, the reticle mark inevitably has a low reflectance because only the reflectance of the reticle mark cannot be changed. In this case, however, since the alignment system shown in FIG. 26 uses only stage light emission, the reticle mark 10A or 11A is subjected to transmission illumination, so the detection precision does not depend on the reflectance. However, the reticle alignment system 41A of this embodiment performs incident-light illumination from the upper side. For this reason, if the reflectance of the reticle mark is low, the light intensity of the obtained image is decreased. In the worst case, the image of the reticle mark cannot be obtained. In such a case, according to this embodiment, the movable mirror 56A is moved to the lower side of the reticle mark having a low reflectance to reflect the incident illumination light beam transmitted through the reticle mark once, thereby performing uniform transmission illumination of the reticle mark from the lower side.

The illumination state when the movable mirror 56A parallel to the reticle 1 is inserted below the reticle 1 as needed will be described below with reference to FIGS. 31 and 32.

Figure 31:
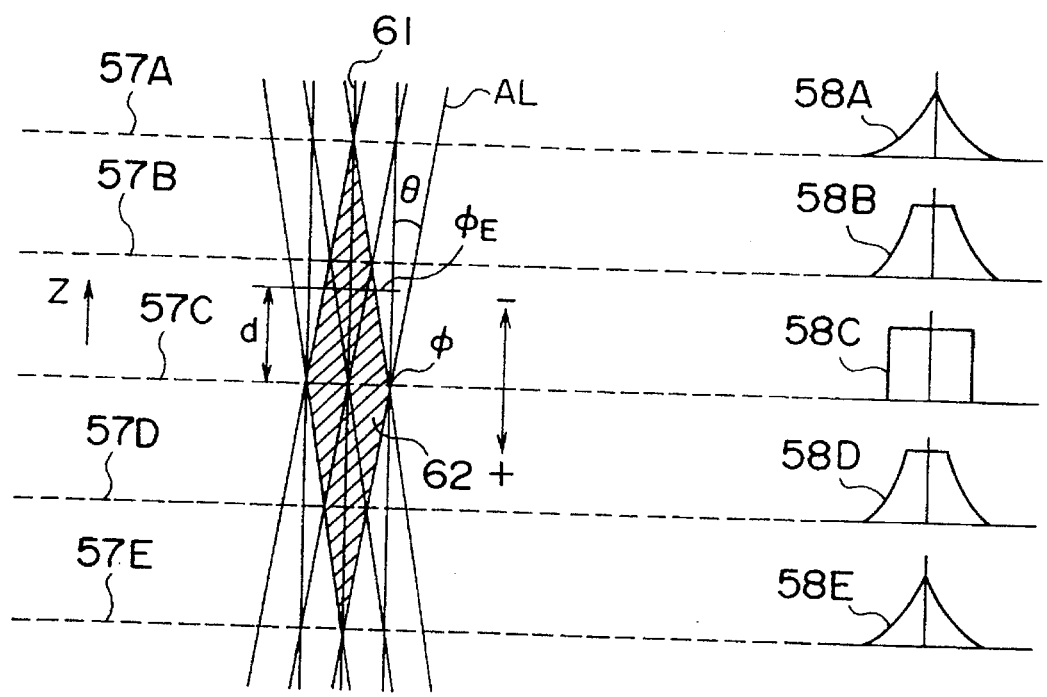
FIG. 31 is a view for explaining a change in illuminance distribution by continuous illumination light.

FIG. 31 is a view showing the optical path of the continuous illumination light beam AL having an illumination field with a uniform illuminance distribution on a plane 57C. A rectangular distribution 58C represents the illuminance distribution on the plane 57 with an optical axis 61 at its center. The illumination area gradually spreads toward planes 57B and 57A which are separated upward from the plane 47C along the optical axis 61 (to be defined as a negative direction). Similarly, the illumination field gradually spreads toward planes 57D and 57E which are separated downward from the plane 57c along the optical axis 61 (in the positive direction). The illuminance distributions on the planes 57A to 57E are shown as distributions 58A to 58E on the right side, respectively. It is found that the uniform illuminance area (area with a flat illuminance distribution) is decreased along with an increase in distance from the plane 57C as a reference in the positive or negative direction. A hatched area 62 indicates the uniform illuminance area.

The diameter of the uniform illuminance area is defined as $\Phi_E$. As shown in FIG. 31, assume an ideal case in which the light beam has a symmetrical shape above and below the plane 57C. If an opening half-angle θ of the continuous illumination light AL is small, the numerical aperture NA can be approximated as NA=sinθ≈θ. In this case, the following relation is satisfied:

$$\Phi_E = \Phi - 2d\theta.$$

where θ is the diameter of the illumination field, and d is the distance from the illumination field in the upward or downward directions (Z direction).

This nature is compatible with a reticle mark having a low reflectance.

Figure 32:
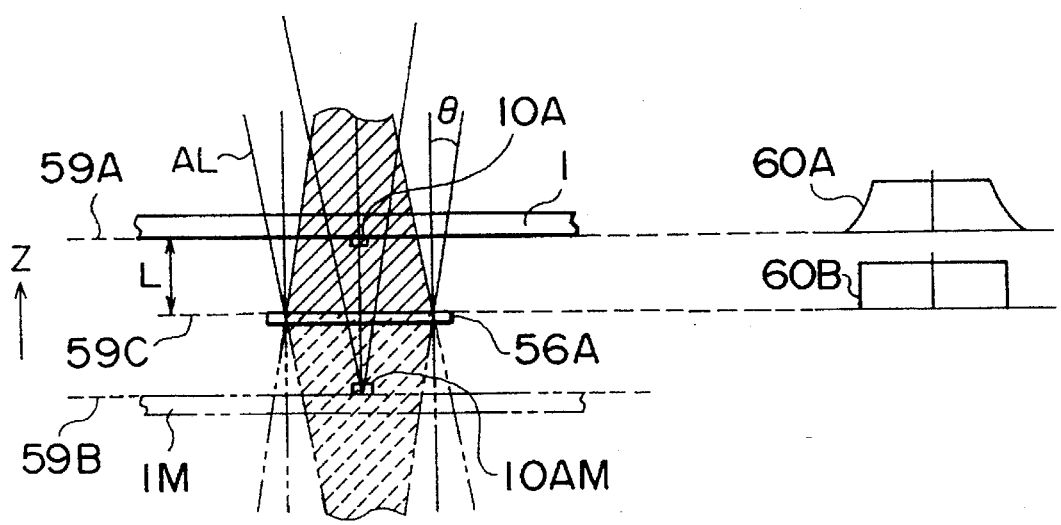
FIG. 32 is a view for explaining transmission illumination of a reticle by a movable mirror.

FIG. 32 is a view showing a state in which the movable mirror 56A is arranged below the reticle mark 10A. Referring to FIG. 32, the movable mirror 56A is arranged at a position separated from the lower surface of the reticle 1 by a distance L to be parallel to the reticle 1. The illumination field of incident-light illumination with the continuous illumination light beam AL corresponds to the mirror surface of the movable mirror 56A. The light beam reflected by the movable mirror 56A indicated by a chain double-dashed line and the reticle 1M as a mirror image are illustrated below the movable mirror 56A. For the normal reticle 1, the movable mirror 56A is not arranged, and the illuminance distribution of the reticle mark 10A is represented by a distribution 60A having a moderate periphery.

In this case, if the uniform illuminance field in the distribution 60A is larger than the actually observed field, uniform illumination is performed. When a reticle having a low reflectance is used, the movable mirror 56A is inserted, as in FIG. 32, thereby illuminating the reticle 1M as a mirror image. That is, a reticle mark 10AM as the mirror image of the reticle mark 10A is subjected to transmission illumination. At this time, it must be taken into consideration how the illuminance changes upon eclipse of the light beam indicated by a solid line by the actual reticle mark 10A.

Figure 33:
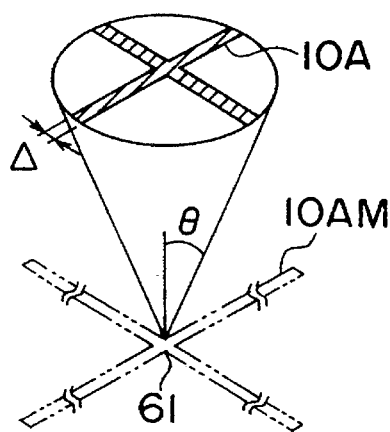
FIG. 33 is a perspective view showing a relationship between the reticle mark as a mirror image and an actual reticle mark in FIG. 32.

FIG. 33 is an enlarged perspective view of the reticle mark 10AM as a mirror image and the reticle mark 10A in FIG. 32. Referring to FIG. 33, the line width of the reticle mark 10A is defined as $\Delta$, and the illuminance on the lower surface of the reticle 1 when no eclipse is present, i.e., when $\Delta=0$, is defined as $E_0$. The interval between the movable mirror 56A and the reticle 1 is defined as L and the numerical aperture NA by the continuous illumination light beam AL is defined as $\sin\theta \approx \theta$, an actual illuminance E at this time satisfies the following relation:

$$E \approx E_0\{1 - 2\Delta/(\pi L\theta)\}$$

If each variable can be set such that $E \approx E_0$ can be considered, the illuminance variations caused by the eclipse by the reticle mark 10A need not be taken into consideration. Even in transmission illumination with the light beam reflected by the movable mirror 56A, an illuminance distribution as the distribution 60A can be obtained. At this time, since the image of the reticle mark 10A by incident illumination is hardly obtained, reticle alignment can be performed using the image by transmission illumination with the light beam reflected by the movable mirror 56A. Note that the state in which $E \approx E_0$ can be considered corresponds to a state in which $(E-E_0)$ is several percent or less of $E_0$, i.e., $2\Delta/(\pi L\theta)$ becomes several percent or less.

As described above, in this embodiment, conventional reticle alignment can be executed for all reticles only by adding a simple mirror mechanism. Additionally, when a normal reticle is to be used, the movable mirrors 56A and 56B need not be moved, resulting in a higher throughput.

Although not illustrated, an illumination system of the continuous illumination light AL as a nonexposure light may be arranged below the reticle 1 in place of the movable mirrors 56A and 56B, and illumination may be performed from the lower side as needed. This arrangement can cope with a reticle having any reflectance. However, a spacial margin is required between the reticle 1 and the projection optical system 3, and the illumination system must be inserted or retreated when a normal reticle is used.

In addition, the illumination field is arranged on the surface of the movable mirror when the movable mirror is located below the reticle. However, this position may be slightly shifted as far as the problem of performance is not posed. If the problem of performance is not posed, the actual illumination field at the position of the reticle mark may slightly protrude from the uniform illuminance area. A dichroic mirror for reflecting the continuous illumination light beam AL and transmitting the pulse illumination light beam BL (exposure light) may be used in place of the movable mirrors 56A and 56B.

Figure 34:
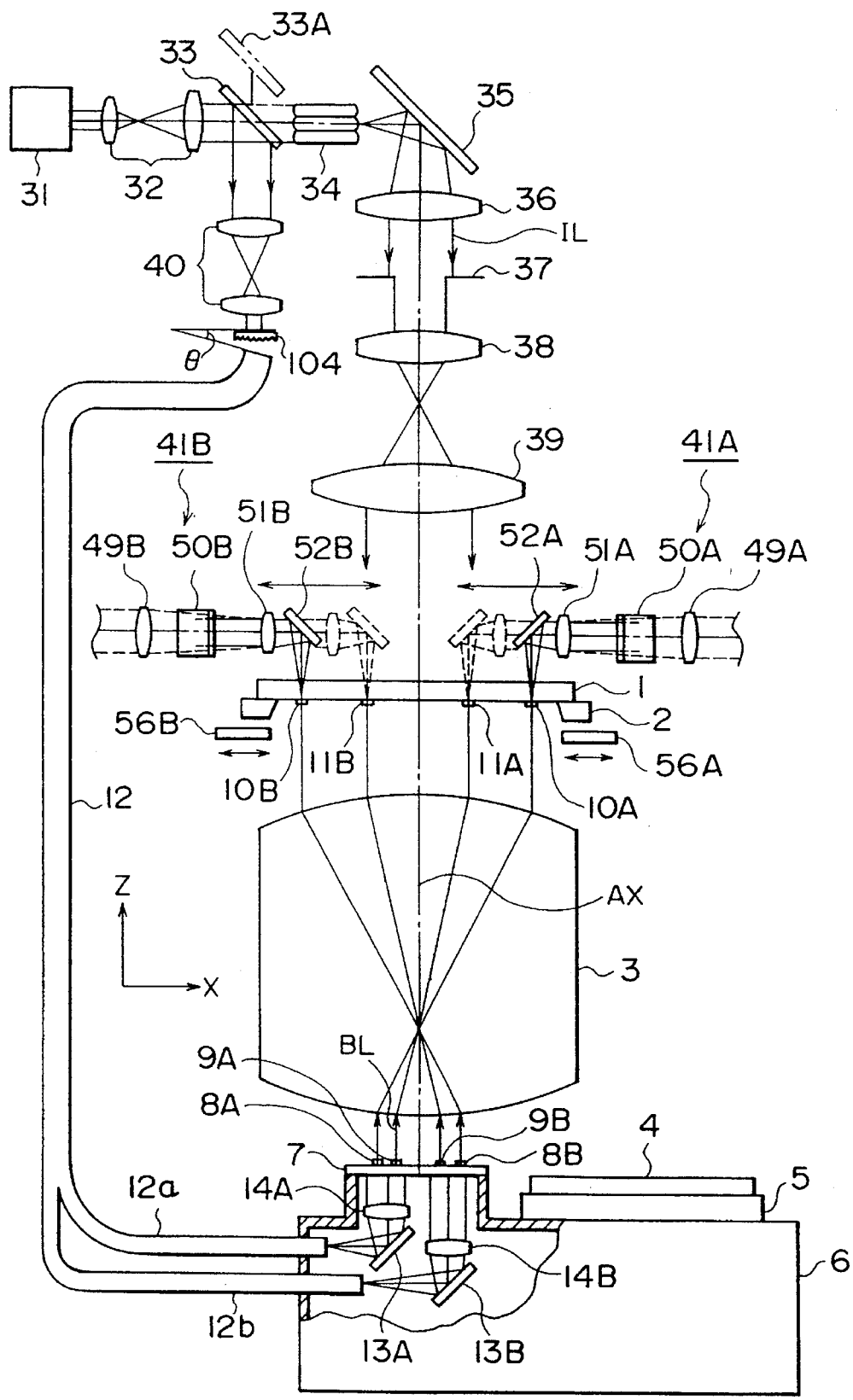
FIG. 34 is a view showing a random light guide and a diffusion plate which are applied to the projection exposure apparatus shown in FIG. 30.

FIG. 34 is a view showing the projection optical apparatus shown in FIG. 30, in which the light guide 12 is replaced with the random light guide 105 shown in FIG. 17, and the diffusion plate 104 is arranged at the incident end. Similarly, a light beam may be supplied to the incident end of the light guide 12 shown in FIG. 30 by the arrangement shown in FIGS. 23 to 25.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application Nos. 6-132395 (132395/1994) filed on May 24, 1994 and 6-212684 (212684/1994) filed on Sep. 6, 1994 are hereby incorporated by reference.

What is claimed is:

1. An alignment apparatus for aligning a mask with an alignment mark and a photosensitive substrate on a substrate stage, comprising:

a first alignment illumination system for illuminating said alignment mark and a reference mark on said substrate stage with a pulse illumination light obtained upon branching a pulsed exposure light;

a second alignment illumination system for illuminating said alignment mark with a continuously emitted continuous illumination light in a wavelength range different from that of the exposure light;

a first objective optical system for focusing the continuous illumination light from said alignment mark, the pulse illumination light from said alignment mark, and the pulse illumination light from said reference mark through a projection optical system;

a wavelength selection optical system for dividing a light beam focused by said first objective optical system into a first light beam of the continuous illumination light and a second light beam of the pulse illumination light;

a second objective optical system for forming an image of said alignment mark from said first light beam;

an image position detector, having photoelectric detector, for relatively vibrating said photoelectric detector and said image of said alignment mark which is formed by said second objective optical system, thereby detecting a position of said image of said alignment mark;

a third objective optical system for forming images of said alignment mark and said reference mark from said second light beam; and an image pickup device for picking up said images of said alignment mark and said reference mark, said images being formed by said third objective optical system, wherein a positional relationship of said mask with respect to said image position detector is detected on the basis of a detection result from said image position detector, and a positional shift between said alignment mark and said reference mark is detected on the basis of a detection result from said image pickup device.

2. An alignment apparatus according to claim 1, wherein said first objective optical system is arranged to be movable in correspondence with the position of said alignment mark on said mask.

3. An alignment apparatus according to claim 1, further comprising a correction optical system, arranged between said wavelength selection optical system and said second objective optical system, for converting the light beam from said first objective optical system into a parallel beam, said correction optical system being movable in a manner interlocked with said first objective optical system.

4. An alignment apparatus according to claim 1, further comprising a correction optical system, arranged between said wavelength selection optical system and said third objective optical system, for converting the light beam from said first objective optical system into a parallel beam, said correction optical system being movable in a manner interlocked with said first objective optical system.

5. An alignment apparatus according to claim 1, wherein said second alignment illumination system performs incident-light illumination of said alignment mark from an upper side of said mask.

6. An alignment apparatus according to claim 5, further comprising a movable mirror, arranged to be freely inserted between said mask and said projection optical system, for reflecting the continuous illumination light transmitted through said mask toward said alignment mark.

7. An alignment apparatus according to claim 6, further comprising a field stop arranged on a plane conjugate with a plane where said movable mirror is arranged in said second alignment illumination system.

8. An alignment apparatus according to claim 1, wherein said wavelength selection optical system comprises a dichroic mirror.

9. A projection exposure apparatus comprising:

an illumination optical system for illuminating a mask on which a target transferred pattern is formed with a pulsed exposure light;

a projection optical system for projecting an image of said pattern on said mask onto a photosensitive substrate with the exposure light;

a substrate stage for supporting said substrate and positioning said substrate on a plane perpendicular to an optical axis of said projection optical system;

a first alignment illumination system for illuminating an alignment mark on said mask and a reference mark on said substrate stage with a pulse illumination light obtained upon branching the pulsed exposure light;

a second alignment illumination system for illuminating said alignment mark with a continuously emitted continuous illumination light in a wavelength range different from that of the exposure light;

a first objective optical system for focusing the continuous illumination light from said alignment mark, the pulse illumination light from said alignment mark, and the pulse illumination light from said reference mark through said projection optical system;

a wavelength selection optical system for dividing a light beam focused by said first objective optical system into a first light beam of the continuous illumination light and a second light beam of the pulse illumination light;

a second objective optical system for forming an image of said alignment mark from said first light beam;

an image position detector, having photoelectric detector, for relatively vibrating said photoelectric detector and said image of said alignment mark which is formed by said second objective optical system, thereby detecting a position of said image of said alignment mark;

a third objective optical system for forming images of said alignment mark and said reference mark from said second light beam; and an image pickup device for picking up said images of said alignment mark and said reference mark, said images being formed by said third objective optical system, wherein a positional relationship of said mask with respect to said image position detector is detected on the basis of a detection result from said image position detector, and a positional shift between said alignment mark and said reference mark is detected on the basis of a detection result from said image pickup device.

10. A projection exposure apparatus according to claim 9, wherein said first alignment illumination system comprising:

a light guide for guiding a parallel beam from said illumination optical system to said alignment mark and said reference mark; and a diffusion optical system, arranged between said illumination optical system and said light guide, for diffusing the parallel beam, and wherein an incident end face of said light guide is arranged to be inclined by a predetermined angle with respect to a plane perpendicular to a direction of incidence of the parallel beam onto said diffusion optical system.

* * * * *